(12) United States Patent
Kim

(10) Patent No.: US 7,466,193 B2
(45) Date of Patent: Dec. 16, 2008

(54) DEVICE AND METHOD OF ELIMINATING DC OFFSET

(75) Inventor: Jae-Wan Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 87 days.

(21) Appl. No.: 11/528,880

(22) Filed: Sep. 28, 2006

(65) Prior Publication Data

US 2007/0075777 A1     Apr. 5, 2007

(30) Foreign Application Priority Data

Oct. 4, 2005     (KR) ...................... 10-2005-0093139

(51) Int. Cl.
*H03F 1/02*     (2006.01)

(52) U.S. Cl. ............................. 330/9; 330/259; 327/307

(58) Field of Classification Search ................. 330/259, 330/9; 327/307; 455/234, 341
See application file for complete search history.

(56) References Cited

U.S. PATENT DOCUMENTS 6,509,777 B2     1/2003     Razavi et al.
6,992,526 B2 *   1/2006     Cheng ............................ 330/9
7,043,206 B2 *   5/2006     Herdey et al. ............... 455/63.1
7,146,141 B2 *   12/2006    Chen ........................ 455/232.1
2005/0110550 A1 * 5/2005    Shi et al. ..................... 327/307

FOREIGN PATENT DOCUMENTS

JP     2003-229918     8/2003

* cited by examiner

*Primary Examiner*—Robert Pascal
*Assistant Examiner*—Hieu P Nguyen
(74) *Attorney, Agent, or Firm*—F. Chau & Assoc., LLC

(57) ABSTRACT

A DC offset elimination device includes a first signal path that delivers a differential input signal pair from an input node to an output node and a second signal path that delivers a differential output signal pair from the output node to the input node. The second signal path includes a first transconductor having an input terminal coupled to the output node, an amplifier having an input terminal coupled to an output terminal of the first transconductor, a capacitor coupled in parallel to the amplifier, and a second transconductor coupled to the output terminal of the amplifier and to the input node.

34 Claims, 11 Drawing Sheets

DEVICE AND METHOD OF ELIMINATING DC OFFSET

CROSS-REFERENCE TO RELATED APPLICATION

This application claims priority under 35 U.S.C § 119 to Korean Patent Application No. 2005-93139 filed on Oct. 4, 2005, the contents of which are herein incorporated by reference in its entirety.

BACKGROUND OF THE INVENTION

1. Technical Field

The present disclosure relates to wireless communications, and more particularly to wireless communications for direct conversion.

2. Discussion of the Related Art

Wireless communication apparatus enables long distance communications by transmitting baseband signals with high-frequency carriers.

A superheterodyne receiver down-converts radio frequency (RF) signals to intermediate frequency (IF) signals, and then down-converts the IF signals to baseband signals. The superheterodyne receiver can utilize a bandpass filter with low selectivity because the superheterodyne receiver uses the IF signals. In addition, the superheterodyne receiver has a lower risk of oscillation than a direct conversion receiver because the superheterodyne receiver amplifies signals not only in the RF stage but also in the IF stage. In addition, the superheterodyne receiver becomes less sensitive to variation of the RF signals because of the use of the IF stage. Therefore, because of these advantages, the superheterodyne receiver is widely used in wireless communications.

A direct conversion receiver directly converts RF signals to baseband signals. The direct conversion receiver has a simple configuration because the direct conversion receiver does not include an IF stage. Thus, the direct conversion receiver may be easily integrated in one chip at a lower price. The direct conversion receiver, however, has disadvantages such as oscillation, selectivity, etc. unlike the superheterodyne receiver. In particular, the direct conversion receiver has the disadvantage of a DC offset.

The direct conversion receiver typically includes a DC offset elimination circuit for eliminating the DC offset.

FIG. 1 is a circuit diagram illustrating a conventional DC offset elimination circuit.

The direct conversion receiver directly converts received RF signals to baseband signals instead of first converting the received RF signals to IF signals. A mixer 10 in the direct conversion receiver converts the received RF signals to the baseband signals. A DC offset elimination device 100 eliminates the DC offset in the baseband signals (input signal pair) inputted through a mixer load 12. That is, the DC offset elimination device 100 receives the input signal pair through an input node 101 and outputs an output signal pair through an output node 102. A variable gain amplifier 110 is disposed on a path from the input node 101 to the output node 102. The variable gain amplifier 110 amplifies the input signal pair and outputs the output signal pair. The DC offset elimination device 100 performs low-pass filtering on the output signal pair and feeds back the filtered signal pair to the input node 101, thereby eliminating the DC offset in the output signal pair. The DC offset is eliminated from the input signal pair at the input node 101 in response to the filtered signal pair.

The DC offset elimination device 100 includes a resistor network 120, an amplifier 130, a capacitor pair 140 and a transconductor 150. The resistor network 120, the amplifier 130 and the capacitor pair 140 correspond to an analog integrator circuit that performs low-pass filtering on the output signal pair. The transconductor 150 extracts the DC offset from the input signal pair at the input node 101 in response to the filtered output signal pair. At the input node 101, the input signal pair and the low-pass filtered output signal pair are separated, and the DC offset in the input signal pair is eliminated. That is, the DC offset elimination device 100 performs high-pass filtering on the input signal pair by using a DC offset elimination loop.

In the direct conversion receiver, the quality of the output signal pair relates to a cutoff frequency of the high-pass filtering, and the quality of the output signal pair is improved as the cutoff frequency decreases. In the configuration illustrated in FIG. 1, the cutoff frequency may be lowered by increasing the resistance of the resistor network 120 and the capacitance of the capacitor pair 140. A larger capacitance can be obtained when the area of a capacitor is increased. A capacitor with a large area, however, has a disadvantage when a DC offset elimination device is implemented into an integrated circuit. Also, a resistor with a large resistance may cause a parasitic capacitance. Thus, there has been a requirement for a DC offset elimination device that may be implemented into a small-sized integrated circuit.

The direct conversion receiver including the DC offset elimination device with a low cutoff frequency requires a long settling time when the direct conversion receiver is turned on. In the conventional direct conversion receiver, the cutoff frequency is increased in order to reduce the settling time, thereby degrading the quality of the signals. Accordingly, there has been a need for a DC offset elimination device having a shortened settling time but that is still capable of maintaining a high signal quality.

SUMMARY OF THE INVENTION

Exemplary embodiments of the present invention provide a DC offset elimination device that has a low cutoff frequency and that can be implemented into a small-sized integrated circuit, and also provide a method of eliminating DC offset.

Exemplary embodiments of the present invention provide a direct conversion receiver including a DC offset elimination device that has a low cutoff frequency and that may be implemented into a small-sized integrated circuit, and also provide a direct conversion method.

Exemplary embodiments of the present invention provide a DC offset elimination device having a shortened settling time, and also provide a method of eliminating DC offset.

Exemplary embodiments of the present invention provide a direct conversion receiver that includes a DC offset elimination device having a shortened settling time, and also provide a direct conversion method.

In exemplary embodiments of the present invention, a DC offset elimination device includes a first signal path and a second signal path. The first signal path delivers a differential input signal pair from an input node to an output node. The second signal path feeds back a differential output signal pair from the output node to the input node. The second signal path includes a first transconductor, an amplifier, a capacitor pair, and a second transconductor. The first transconductor has an input terminal coupled to the output node, and the amplifier has an input terminal coupled to an output terminal of the first transconductor. The capacitor pair is coupled in parallel to the amplifier, and the second transconductor is coupled to the output terminal of the amplifier and to the input node.

In an exemplary embodiment of the present invention, the first transconductor may be implemented with an operational transconductance amplifier (OTA) that includes a bias circuit providing a bias current; a transconducting circuit providing a current pair corresponding to a first portion of the bias current in response to the differential output signal pair; a current divider bypassing a second portion of the bias current in response to the differential pair, in which a sum of the first portion and the second portion is equal to the bias current; and an output circuit mirroring the current pair to output the mirrored current pair.

In an exemplary embodiment of the present invention, the first transconductor may be implemented with an OTA that includes a bias circuit providing a bias current; a first transconducting circuit providing a first current pair corresponding to a first portion of the bias current in response to the differential output signal pair; a second transconducting circuit providing a second current pair corresponding to a second portion of the bias current in response to the differential output signal pair, in which a sum of the first portion and the second portion is equal to the bias current; a switching circuit bypassing the second current pair or summing the first and the second current pairs in response to the control signal; and an output circuit mirroring one of the first current pair and the sum of the first and the second current pairs to output the mirrored current pair(s).

In an exemplary embodiment of the present invention, the first transconductor may be implemented with an OTA that includes a bias circuit configured to provide a bias current such that a magnitude of the bias current is varied in response to the control signal; a transconducting circuit configured to provide a current pair corresponding to a first portion of the bias current in response to the differential output signal pair; a current divider configured to bypass a second portion of the bias current in response to the differential output signal pair, a sum of the first portion and the second portion being equal to the bias current; and an output circuit configured to mirror the current pair to output the mirrored current pair.

In exemplary embodiments of the present invention, a direct conversion receiver includes an RF module configured to receive an RF signal; a mixer configured to convert the RF signal into a baseband signal pair; and a DC offset elimination device configured to eliminate a DC offset of the baseband signal pair. The DC offset elimination device includes a first signal path configured to deliver the baseband signal pair from an input node to an output node; and a second signal path for feeding back a differential output signal pair from the output node to the input node. The second signal path includes a first transconductor having an input terminal coupled to the output node; an amplifier having an input terminal coupled to an output terminal of the first transconductor; a capacitor pair coupled in parallel to the amplifier; and a second transconductor coupled to the output terminal of the amplifier and to the input node.

In an exemplary embodiment of the present invention, the first transconductor may be implemented with an OTA that includes a bias circuit configured to provide a bias current; a transconducting circuit configured to provide a current pair corresponding to a first portion of the bias current in response to the differential output signal pair; a current divider configured to bypass a second portion of the bias current in response to the differential pair, a sum of the first portion and the second portion being equal to the bias current; and an output circuit configured to mirror the current pair to output the mirrored current pair.

In an exemplary embodiment of the present invention, the first transconductor may be implemented with an OTA that includes a bias circuit configured to provide a bias current; a first transconducting circuit configured to provide a current pair corresponding to a first portion of the bias current in response to the differential output signal pair; a second transconducting circuit configured to provide a current pair corresponding to a second portion of the bias current in response to the differential output signal pair, a sum of the first portion and the second portion being equal to the bias current; a switching circuit configured to bypass the second current pair or sum the first and the second current pairs in response to the control signal; and an output circuit configured to mirror one of the first current pair and the sum of the first and the second current pairs to output the mirrored current pair.

In an exemplary embodiment of the present invention, the first transconductor may be implemented with an OTA that includes a bias circuit configured to provide a bias current such that a magnitude of the bias current is varied in response to the control signal; a transconducting circuit configured to provide a current pair corresponding to a first portion of the bias current in response to the differential output signal pair; a current divider configured to bypass a second portion of the bias current in response to the differential output signal pair, a sum of the first portion and the second portion being equal to the bias current; and an output circuit configured to mirror the current pair to output the mirrored current pair.

In exemplary embodiments of the present invention, a method of eliminating a DC offset includes providing a differential output signal pair by delivering a differential input signal pair from an input node to an output node through a first signal path; converting the differential output signal pair to a current pair; integrating the current pair into a voltage pair; converting the voltage pair into a feedback current pair; and providing the feedback current pair to the input node.

In an exemplary embodiment of the present invention, converting the differential output signal pair to the current pair may include providing a bias current; providing a first current pair corresponding to a first portion of the bias current in response to the differential output signal pair; bypassing a second portion of the bias current in response to the differential output signal pair, a sum of the first portion and the second portion being equal to the bias current; and mirroring the first current pair to output the mirrored current pair as the current pair.

In an exemplary embodiment of the present invention, converting the differential output signal pair to the current pair may include providing a bias current; providing a first current pair corresponding to a first portion of the bias current pair in response to the differential output signal pair; providing a second current pair corresponding to a second portion of the bias current pair in response to the differential output signal pair, a sum of the first portion and the second portion being equal to the bias current; selecting one of bypassing the second current pair or summing the first and the second current pairs; and mirroring one of the first current pair and the sum of the first and second current pairs to output the current pair.

In an exemplary embodiment of the present invention, converting the differential output signal pair to the current pair may include providing a bias current, a magnitude of the bias current being varied in response to a control signal; providing a first current pair corresponding to a first portion of the bias current in response to the differential output signal pair; bypassing a second portion of the bias current in response to the differential output signal pair; and mirroring the first current pair to output the mirrored current pair as the current pair.

In exemplary embodiments of the present invention, a direct conversion method includes down-converting a received RF signal to provide a baseband signal pair; providing a differential output signal pair by delivering the baseband signal pair from an input node to an output node through a first signal path; converting the differential output signal pair to a current pair; integrating the current pair into a voltage pair; converting the voltage pair into a feedback current pair; and providing the feedback current pair to the input node to eliminate a DC offset in the baseband signal.

In an exemplary embodiment of the present invention, converting the differential output signal pair to the current pair may include providing a bias current; providing a first current pair corresponding to a first portion of the bias current in response to the differential output signal pair; bypassing a second portion of the bias current in response to the differential output signal pair, a sum of the first portion and the second portion being equal to the bias current; and mirroring the first current pair to output the mirrored current pair as the current pair.

In an exemplary embodiment of the present invention, converting the differential output signal pair to the current pair may include providing a bias current; providing a first current pair corresponding to a first portion of the bias current in response to the differential output signal pair; providing a second current pair corresponding to a second portion of the bias current in response to the differential output signal pair, a sum of the first portion and the second portion being equal to the bias current; selecting one of bypassing the second current pair or summing the first and the second current pairs; and mirroring one of the first current pair and the sum of the first and second current pairs to output the current pair.

In an exemplary embodiment of the present invention, converting the differential output signal pair to the current pair may include providing a bias current, a magnitude of the bias current being varied in response to a control signal; providing a first current pair corresponding to a first portion of the bias current in response to the differential output signal pair; bypassing a second portion of the bias current in response to the differential output signal pair; and mirroring the first current pair to output the mirrored current pair as the current pair.

Therefore, the DC offset elimination device and direct conversion receiver in accordance with exemplary embodiments of the present invention may have a low cutoff frequency and may be implemented in a small size.

BRIEF DESCRIPTION OF THE DRAWINGS

Exemplary embodiments of the present invention will be understood in more detail from the following descriptions taken in conjunction with the accompanying drawings, in which.

DESCRIPTION OF EXEMPLARY EMBODIMENTS

Figure 1:
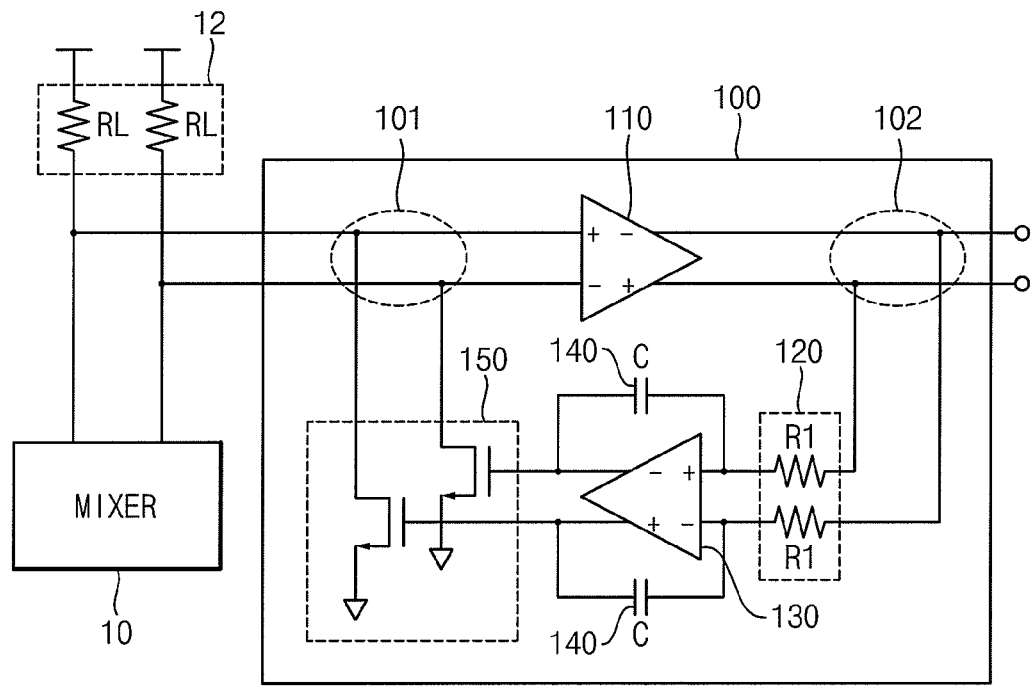
FIG. 1 is a circuit diagram illustrating a configuration of a conventional DC offset elimination device.
Figure 2:
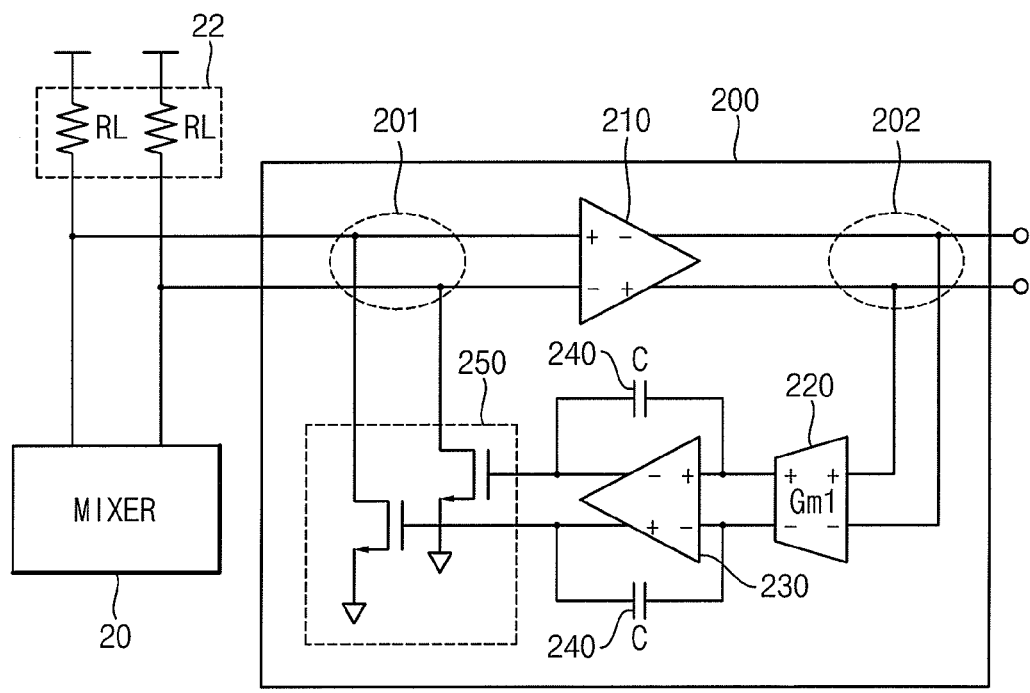
FIG. 2 is a circuit diagram illustrating a configuration of a DC offset elimination device in accordance with an exemplary embodiment of the present invention.

FIG. 2 is a circuit diagram illustrating a configuration of a DC offset elimination device in accordance with an exemplary embodiment of the present invention.

Referring to FIG. 2, a DC offset elimination device 200 includes an input node 201, a variable gain amplifier 210, a first transconductor 220, a capacitor pair 240, a differential operational (OP) amplifier 230 and a second transconductor 250. The DC offset elimination device 200 receives a baseband signal from a mixer 200 through the input node 201. The DC offset elimination device 200 eliminates the DC offset in the baseband signal and outputs the signal through the output node.

The DC offset elimination 200 includes a first signal path and a second signal path. The first signal path amplifies baseband signals and outputs the amplified signals. That is, the first signal path delivers a differential signal pair from the input node 201 to the output node 202. Hereinafter, the differential signal pair at the input node 201 is referred to as a differential input signal pair and the differential signal pair at the output node 202 is referred to as a differential output signal pair. The second signal path filters the differential output signal pair through a low-pass filter and the filtered signals are provided to the second transconductor 250 that is connected to the input node 201. That is, the second signal path delivers the differential output signal pair from the output node 202 to the input node 201. Unlike the arrangement of the variable gain amplifier shown in FIG. 2, the DC offset elimination device may be implemented such that the variable gain amplifier 210 may be disposed in front of the input node 201, or behind the output node 202.

The second signal path includes the first transconductor 220, the differential OP amplifier 230, the capacitor pair 240 and the second transconductor 250. The first transconductor 220 is coupled to the output node 202, and the differential OP amplifier 230 has an input terminal coupled to an output terminal of the first transconductor 220. The capacitor pair 240 is coupled to the input and output terminals of the differential OP amplifier 230, and the capacitor pair 240 stores charges generated by a differential current pair. The second transconductor 250 is coupled to the input terminal of the differential OP amplifier 230 and to the input node 201, and converts an output voltage pair of the differential OP amplifier 230 to a feedback current pair. For example, the first transconductor 220 may be implemented with an operational transconductance amplifier (OTA) and the second transconductor 250 may be implemented with MOS transistors.

The cutoff frequency "fc" of the DC offset elimination device 200 is evaluated by Equation 1.

$$f_c = \frac{A}{2\pi} \frac{g_1}{C} g_2 R \quad \text{[Equation 1]}$$

Here, "A" denotes a gain of the first signal path, and "C" denotes a capacitance of the capacitor pair 240, and "R" denotes a resistance of the mixer load 22, and "g1" denotes a conductance of the first transconductor 220, and "g2" denotes a conductance of the second transconductor 250.

Referring to the Equation 1, the cutoff frequency "fc" is lowered when "C" is increased, or "A," "g1," "g2" and "R" are decreased. "A," the gain of the first signal path, is determined depending on how much the baseband signals are amplified, and "R" denotes a resistance of the mixer load. The conductance "g2" of the second transconductor 250 has a value needed to deliver the feedback signals to the input node 201. Therefore, the capacitance "C" and the conductance "g1" may be controlled in order to lower the cutoff frequency "fc". The capacitance "C" can be increased by increasing an area of the capacitor. The DC offset elimination device 200 having a large area, however, is difficult to be integrated into one small-sized chip. Thus, the conductance "g1" is required to have a small value to reduce the cutoff frequency. The conductance "g1" of the first transconductor 220 may be represented by Equation 2.

$$g_1 = \frac{2\pi AC}{g_2 R} f_c \quad \text{[Equation 2]}$$

As shown in Equation 2, when the conductance "g1" is very small, the cutoff frequency of the DC offset elimination device 200 will have a sufficiently small value. For example, a transconductor having a very small conductance may be implemented with an OTA.

Figure 3:
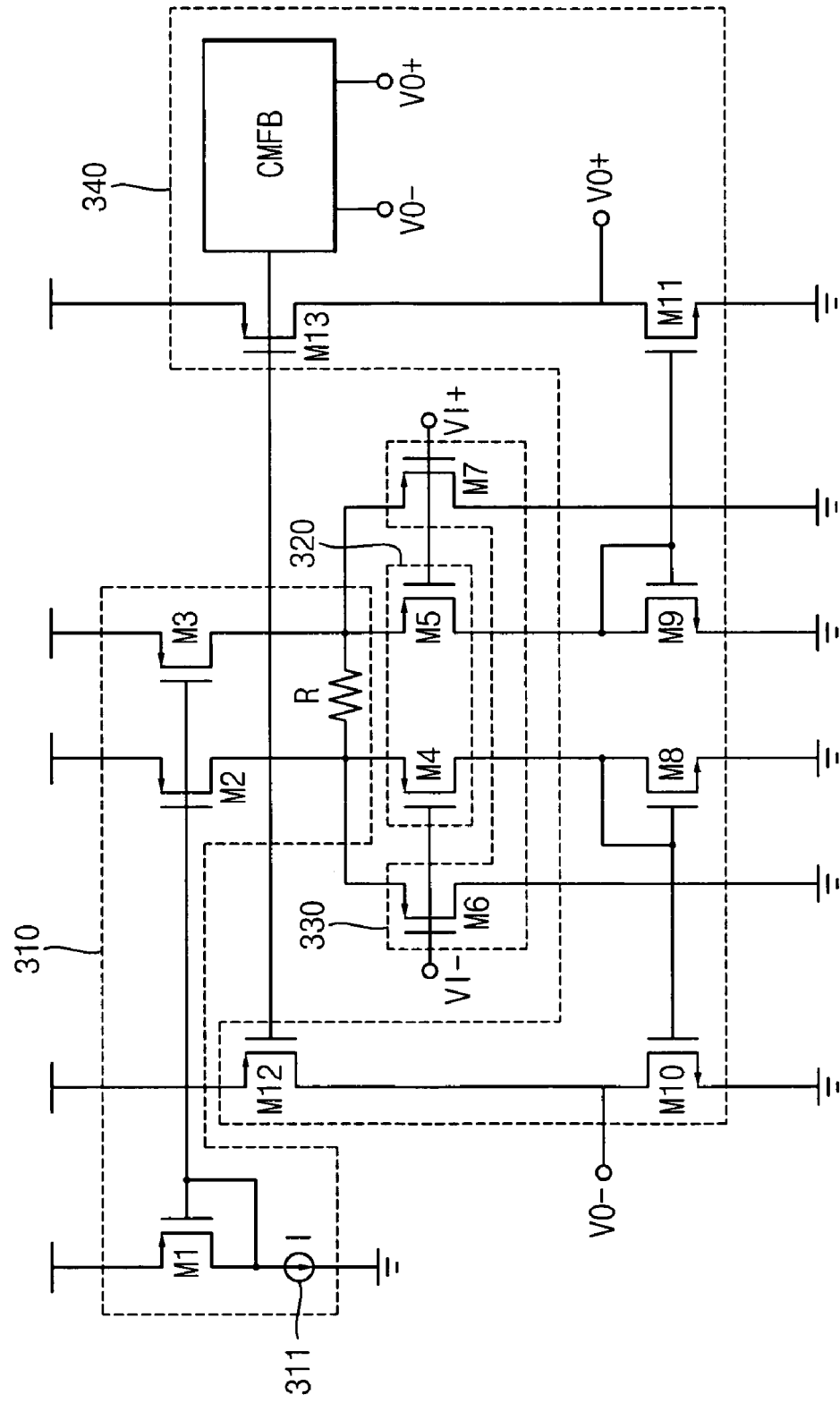
FIG. 3 is a circuit diagram of an operational transconductance amplifier (OTA) in accordance with an exemplary embodiment of the present invention.

FIG. 3 is a circuit diagram of an OTA in accordance with an exemplary embodiment of the present invention.

Referring to FIG. 3, the OTA includes a bias current circuit 310, a transconducting circuit 320, a current divider 330 and an output circuit 340. The bias current circuit 310 provides a bias current. The first transconducting circuit 320 provides a first current pair corresponding to one portion, that is, a first portion of the bias current in response to a differential output current pair. The current divider 330 bypasses the other portion, that is, a second portion, of the bias current in response to the differential output signal pair. The output circuit 340 mirrors the first current pair to provide the mirrored current pair.

The bias circuit 310 includes a current source 311, a first transistor M1 of which a gate and a source are coupled to the current source 311, a second transistor M2 and a third transistor M3 the gates of which are coupled to the gate of the first transistor M1 and a resistor "R" that is coupled to the drains of the second transistor M2 and the third transistor M3. The second transistor M2 and the third transistor M3 provide the bias current by mirroring a reference current I flowing through the first transistor M1.

The first transconducting circuit 320 includes a fourth transistor M4 the source of which is coupled to the drain of the second transistor M2 and a fifth transistor M5 the source of which is coupled to the drain of the third transistor M3. The differential output signal pair is applied to the gates of the fourth M4 and fifth M5 transistors, and the first current pair corresponding to the second portion of the bias current is outputted at the drains of the fourth and fifth transistors M4 and M5 in response to the differential output signal pair.

The current divider 330 includes a sixth transistor M6 the source of which is coupled to the drain of the second transistor M2 and the gate of which is coupled to the gate of the fourth transistor M4, and includes a seventh transistor M7 the source of is coupled to the drain of the third transistor M7 and the gate of which is coupled to the gate of the fifth transistor M5. The differential output signal pair is applied to the gates of the sixth and seventh transistors M6 and M7, and the second current pair corresponding to the second portion of the bias current is outputted at the drain of the sixth and seventh transistor M6 and M7 in response to the differential output signal pair.

For example, the sixth and seventh transistors M6 and M7 may have greater current driving capabilities than the fourth and fifth transistors M4 and M5, that is, M(M>1) times greater driving capability. In this case, the conductance "g1" is evaluated by Equation 3.

$$g_1 = \frac{g_{M4,5}}{1 + (M+1)g_{M4,5}\frac{R}{2}} \quad \text{[Equation 3]}$$

Here, "$g_{M4,5}$" denotes the conductance of the fourth and fifth transistors M4 and M5. Therefore, "g1" may become substantially smaller as "M" becomes large.

The output circuit 340 receives the first current pair from the first transconducting circuit 320 to mirror the first current pair, and then outputs the mirrored current pair. The output circuit 340 includes an eighth transistor M8 the gate and drain of which are coupled to the drain of the fourth transistor M4, a ninth transistor M9 the gate and drain of which are coupled to the drain of the fifth transistor M5, a tenth transistor M10 the gate of which is coupled to the gate of the eighth transistor M8, an eleventh transistor M11 the gate of which is coupled to the gate of the ninth transistor M9, a common mode feedback (CMFB) circuit, a twelfth transistor M12 the gate of which is coupled to the CMFB circuit and the drain of which is coupled to the drain of the tenth transistor M10, and a thirteenth transistor M13 the gate of which is coupled to the CMFB circuit and the drain of which is coupled to the drain of the eleventh transistor M11.

The first current pair provided by the fourth and fifth transistors M4 and M5 in response to the differential output signal pair flows through the drains of the eighth and ninth transistors M8 and M9. The tenth transistor M10 mirrors the drain current of the eighth transistor M8, and the eleventh transistor M11 mirrors the drain current of the ninth transistor M9. The twelfth transistor M12, the thirteenth transistor M13 and the CMFB feed back the mirrored current pair.

Figure 4:
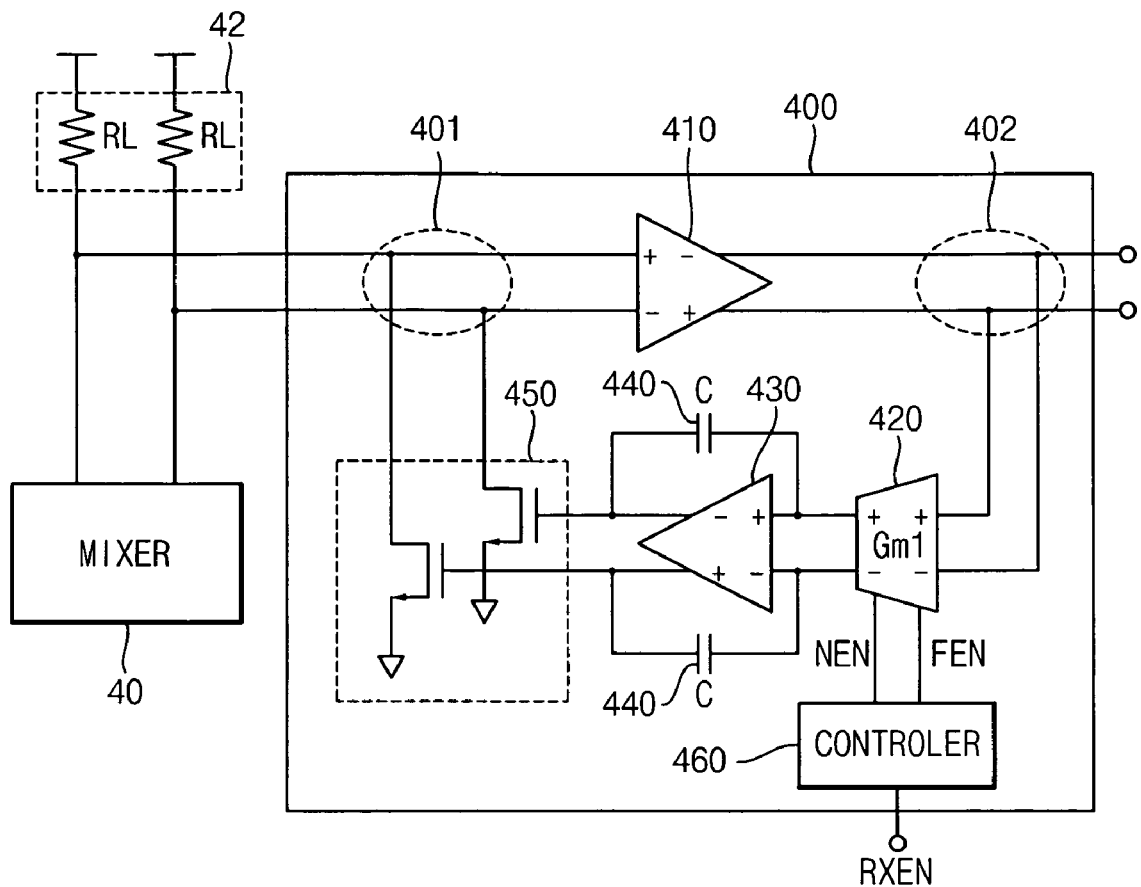
FIG. 4 is a circuit diagram illustrating a configuration of a DC offset elimination device in accordance with an exemplary embodiment of the present invention.

Through this current division, the OTA in FIG. 4 may have a very small conductance. The DC offset elimination device 300 of FIG. 3 can have a very low cutoff frequency by utilizing the OTA having a very small conductance. That is, the low cutoff frequency of the DC offset elimination device results in good quality signals.

Hereinafter, a DC offset elimination device having a shortened settling time and capable of maintaining a high signal quality will be described with reference to FIG. 4

FIG. 4 is a circuit diagram illustrating a configuration of a DC offset elimination device in accordance with an exemplary embodiment of the present invention.

Referring to FIG. 4, the DC offset elimination device 400 includes an input node 401, a variable gain amplifier 410, a first transconductor 420, a capacitor pair 440, a differential OP amplifier 430 and second transconductor 450. The DC offset elimination device 400 receives the baseband signals from a mixer 40 through an input node 401, and then eliminates the DC offset in the baseband signals and outputs the signals at the output node 402. The DC offset elimination device 400 further includes a controller 460 in order to shorten the initial settling time.

The DC offset elimination device 400 includes a first signal path and a second signal path.

The first signal path amplifies a differential input signal pair and outputs the differential output signal pair. That is, the first signal path delivers a differential signal pair from the input node 401 to the output node 402. As defined with respect to FIG. 2, the differential signal pair at the input node 401 is referred to as a differential input signal pair and the differential signal pair at the output node 402 is referred to as a differential output signal pair. The second signal path filters the differential output signal pair through a low-pass filter and the filtered signals are provided to the second transconductor 450 that is connected to the input node 401. That is, the second signal path delivers the differential output signal pair from the output node 402 to the input node 401. Unlike the variable gain amplifier shown in FIG. 4, the DC offset elimination device may be implemented such that the variable gain amplifier 410 is disposed in front of the input node 401, or behind the output node 402.

The second signal path includes the first transconductor 420, the differential OP amplifier 430, the capacitor pair 440 and the second transconductor 250. The first transconductor 420 is coupled to the output node 402, and the differential OP amplifier 430 has an input terminal coupled to an output terminal of the first transconductor 420. The capacitor pair 440 is coupled to the input and output terminals of the differential OP amplifier 430, and the capacitor pair 440 stores charges generated by a differential current pair. The second transconductor 450 is coupled to the input node 401, and converts an output voltage pair of the differential OP amplifier 430 to a feedback current pair.

The input node 401, the output node 402, the variable gain amplifier 410, the capacitor pair 440, the differential OP amplifier 430 and the second transconductor 450 perform the same or similar operations as the input node 201, the output node 202, the variable gain amplifier 210, the capacitor pair 240, the differential OP amplifier 230 and the second transconductor 250 in FIG. 2, respectively. Hence, the descriptions about the input node 401, the output node 402, the variable gain amplifier 410, the capacitor pair 440, the differential OP amplifier 430 and the second transconductor 450 are omitted.

The cutoff frequency "fc" of the DC offset elimination device 400 is evaluated by using Equation 1 as described above. The cutoff frequency "fc" depends on a conductance of the first transconductor 420, and the cutoff frequency "fc" relates to the initial settling time. The cutoff frequency "fc" of the direct conversion receiver may not be low at the initial settling, because control signals with little data are transmitted during the initial settling and much more data are transmitted after the initial settling is completed in wireless communications.

When the direct conversion receiver is turned on, the controller 460 enlarges the conductance of the first transconductor 420 in order to shorten the initial settling time. When the initial settling is completed, the controller 460 reduces the conductance of the first transconductor 420 in order to lower the cutoff frequency. That is, during the initial setting operation, the controller 460 provides a first control signal FEN to the first transconductor 420, and the conductance of the transconductor 420 is increased in response to the first control signal FEN. When the initial settling operation is completed, the controller 460 provides a second control signal NEN to the first transconductor 420, and the conductance of the first transconductor 420 is decreased in response to the second control signal NEN.

Figure 5:
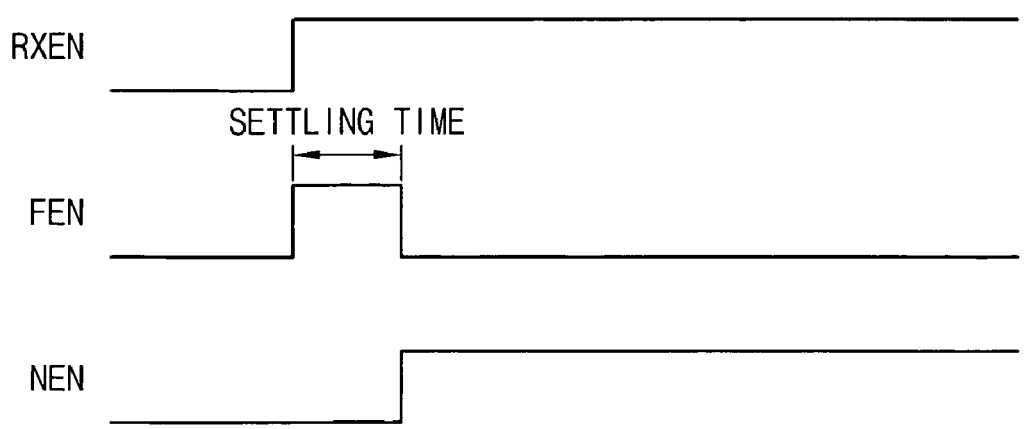
FIG. 5 is a timing diagram illustrating signals of a controller in accordance with an exemplary embodiment of the present invention.

FIG. 5 is a timing diagram illustrating signals of the controller in accordance with an exemplary embodiment of the present invention.

Referring to FIG. 5, the controller 460 in FIG. 4 activates the first control signal FEN in response to an enable signal RXEN that enables the direct conversion receiver, or the DC offset elimination device. After the initial settling time, the controller 460 deactivates the first control signal FEN and activates the second control signal NEN.

Figure 6:
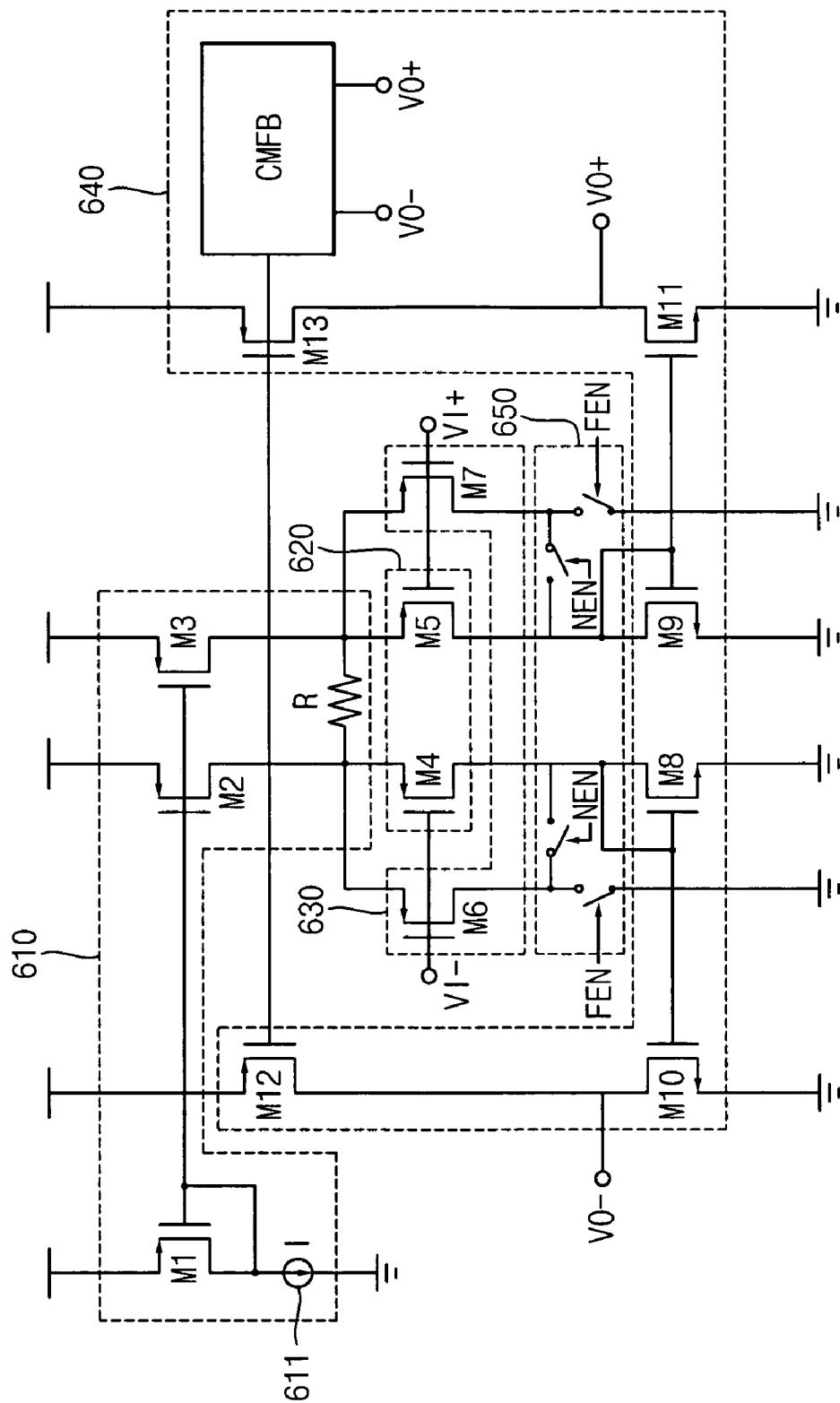
FIG. 6 is a circuit diagram of an OTA in accordance with an exemplary embodiment of the present invention.

FIG. 6 is a circuit diagram of an OTA in accordance with an exemplary embodiment of the present invention.

Referring to FIG. 6, the OTA circuit includes a bias current circuit 610 providing a bias current, a first transconducting circuit 620 providing a first current pair corresponding to a first portion of a bias current according to a differential output current pair, a second transconducting circuit 630 providing a second current pair corresponding to a second portion of the bias current according to the differential output current pair, a switching circuit 650 bypassing the second current pair according to a control signal or summing the first and second current pairs, and an output circuit 640 mirroring the first current pair or the sum of the first and second current pairs to provide the mirrored current pair(s).

The bias circuit 610, the first transconducting circuit 620 and the output circuit 640 execute substantially the same or similar operations as the bias circuit 310, the transconducting circuit 320 and the output circuit 340 shown in FIG. 3, respectively. Hence, the descriptions about the bias circuit 610, the first transconducting circuit 620 and the output circuit 640 are omitted.

The second transconducting circuit 630, like the current divider 330 in FIG. 3, includes two transistors M6 and M7, and provides the second current pair corresponding to the second portion of the bias current in response to the differential output signal pair.

The switching circuit 650 bypasses the second current pair provided by the second transconducting circuit 630 or sums the first and the second current pairs in response to the control signal type. During the initial settling, the switching circuit 650 causes the first and second current pairs to join together in response to a first control signal FEN and a second control signal NEN. The joined first and second current pairs are outputted through the transistors M8 and M9, respectively. After the initial settling is completed, the switching circuit 650 bypasses the second current pair in response to the first control signal FEN and the second control signal NEN. For example, the switching circuit 650 may include a first switch and a second switch that operate in response to the first and second control signals FEN and NEN, respectively. The conductance of the OTA becomes greater when the first control signal FEN is inputted rather than when the second control signal NEN is inputted. Therefore, a DC offset elimination device, which include the OTA as shown in FIG. 6, has a short initial settling time and a low cutoff frequency after the initial settling. Hereinafter, there will be a detailed description of another configuration of an OTA that has a varying conductance based on control signals.

Figure 7:
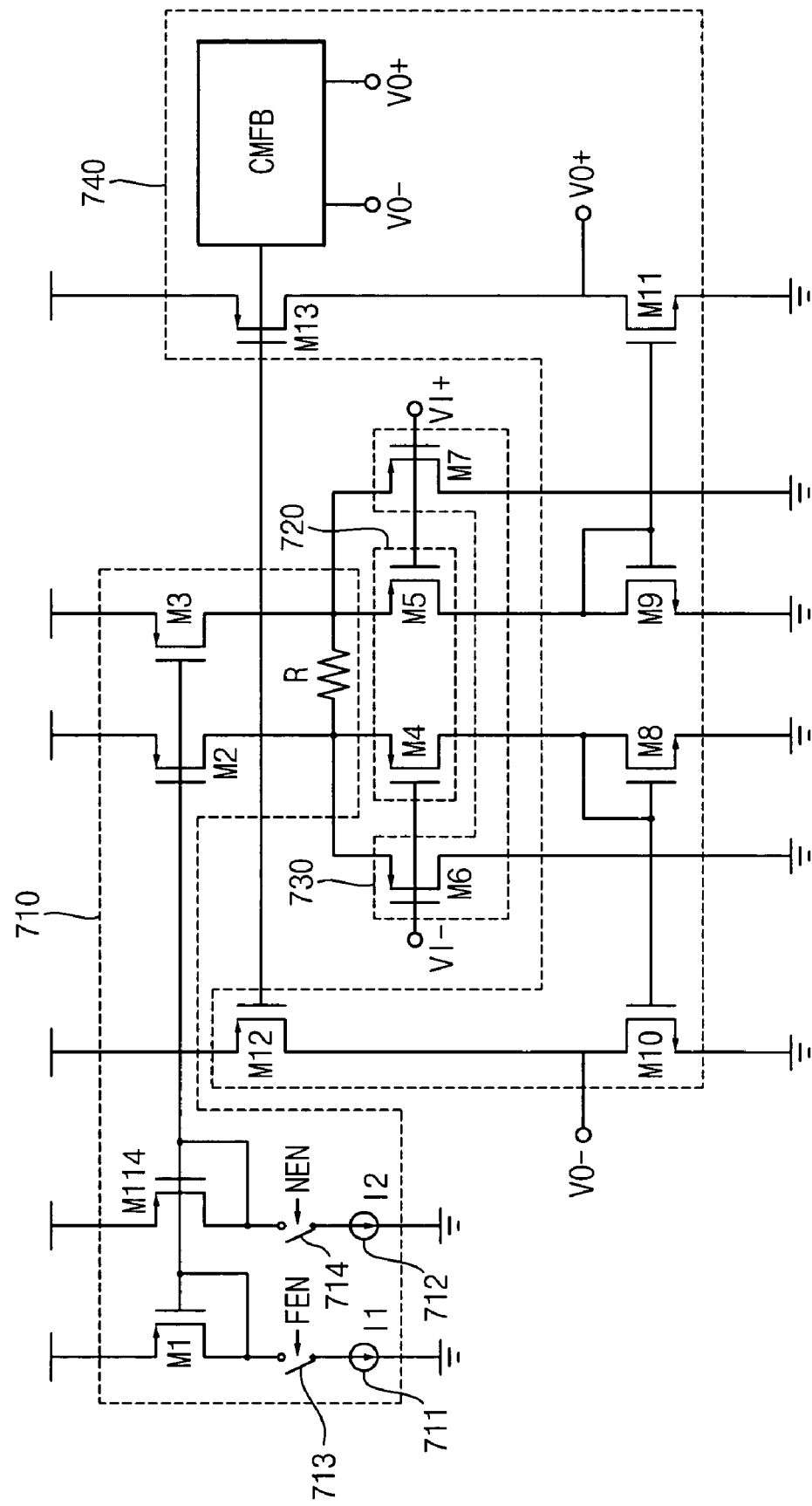
FIG. 7 is a circuit diagram of an OTA in accordance with an exemplary embodiment of the present invention.

FIG. 7 is a circuit diagram of an OTA in accordance with an exemplary embodiment of the present invention.

Referring to FIG. 7, an OTA circuit includes a bias current circuit 710 providing a bias current, a first transconducting circuit 720 providing a first current pair by a first portion of the bias current in response to a differential output current pair, a current divider 730 bypassing a second portion of the bias current in response to the differential output signal pair, and an output circuit 740 mirroring the current pair to provide the mirrored current pair.

The first transconducting circuit 720, the current divider 730 and the output circuit 740 perform substantially the same or similar operation as the transconducting circuit 320, the current divider 330, and the output circuit 340 shown in FIG. 3. Hence, the descriptions about the transconducting circuit 720, the current divider 720 and the output circuit 740 are omitted.

The bias circuit 710 includes a first current source 711 providing a first current I1, a second current source 712 providing a second current I2, a first transistor M1, a fourteenth transistor M14 the gate and source of which are coupled to each other, a second and third transistors M2 and M3 the gates of which are coupled to the gates of the first and fourteenth transistors M1 and M14 and a resistor that is coupled to the drains of the second and third transistors M2 and M3. In addition, the bias circuit 710 includes a first switch 713 that is coupled to the first current source 710 and to the first transistor M1 and a second switch 714 that is coupled to the second current source M2 and to the fourteenth transistor M14. When the first switch 713 is turned on in response to the first control signal FEN, the second and third transistors M2 and M3 provide the bias current that is mirrored from the first current I1 of the first current source 711. When the second switch 714 in response to the second control signal NEN is turned on, the second and third transistors M2 and M3 provide the bias current that is mirrored from the second current I2 of the second current source 712.

For example, the first switch 713 may be turned on and the second switch 714 may be turned off during the initial settling of the DC offset elimination device. Here, the first current of the first current source 711 is greater than the second current I2 of the second current source 712. Therefore, the conductance of the DC offset elimination device may be smaller after the initial settling than during the initial settling time.

Figure 8:
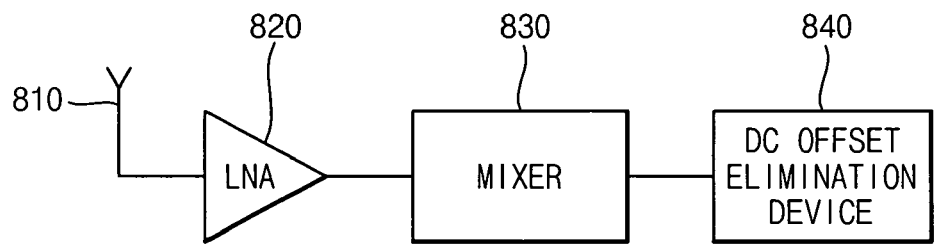
FIG. 8 is a block diagram illustrating a configuration of a direct conversion receiver in accordance with an exemplary embodiment of the present invention.

The above OTA circuits for DC offset elimination device are illustrative of exemplary embodiments of the present invention and are not to be construed as limiting thereof. For example, there may be an OTA circuit that does not include a current divider and generates a different amount of bias current depending on a variable control voltage. Also, there may be an OTA that includes both the advantage of the OTA shown in FIG. 6, which bypasses the second current pair or sums the second current pair and the first current pair in response to the control voltage, and the advantage of the OTA shown in FIG. 7, which provides a different amount of bias current in response to the control voltage. Although exemplary embodiments of this invention have been described, those skilled in the art will readily appreciate that many modifications are possible without materially departing from the novel teachings and advantages of this invention:

FIG. 8 is a block diagram illustrating a configuration of a direct conversion receiver in accordance with an exemplary embodiment of the present invention.

The direct conversion receiver includes an RF receiving unit 810, a low noise amplifier (LNA) 820, a mixer 830 and a DC offset elimination device 840.

The RF receiving unit 810 receives an RF signal that is transmitted via some media. The RF receiving unit 810 may include an antenna and a bandpass filter for receiving the RF signal. The LNA 820 amplifies the received RF signal. The received and amplified RF signal via an RF module including the RF receiving unit 810, LNA 820, etc. is provided to the mixer 830.

The mixer 830 receives the RF signal from the RF module and then down-converts the RF signal directly to a baseband signal.

The DC offset elimination device 840 eliminates the DC offset in the baseband signal and then outputs the baseband signal in which the DC offset has been substantially removed. The DC offset elimination device 840 may be one of the above-described DC offset elimination device in accordance with exemplary embodiments of the present invention.

A direct conversion method will be described in detail hereinafter.

Figure 9:
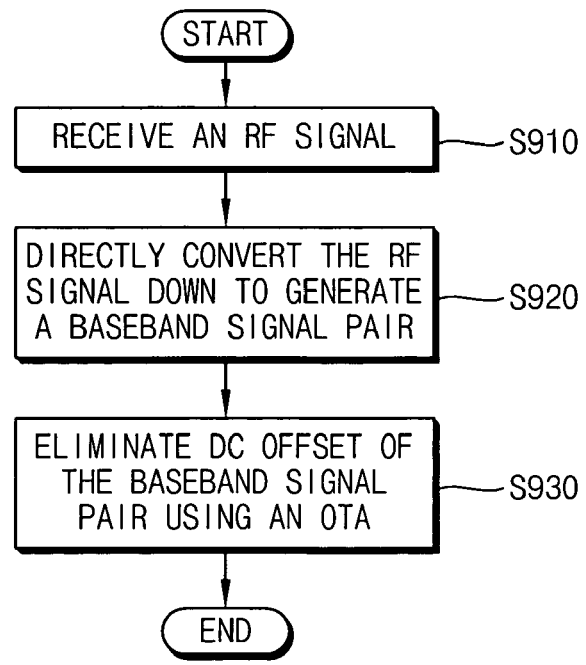
FIG. 9 is a flow chart illustrating a direct-conversion receiving process in accordance with an exemplary embodiment of the present invention.

FIG. 9 is a flow chart illustrating a direct conversion method in accordance with an exemplary embodiment of the present invention.

The direct conversion method includes receiving an RF signal (step S910), generating a baseband signal pair (step S920) and eliminating the DC offset in the baseband signal pair by using an OTA (step S930).

In receiving the RF signal (step S910), necessary RF signals among the signals transmitted via the media are received and amplified for signal processing. In generating a signal pair (step S920), the RF signals are directly down-converted to the baseband signal pair, for example, a differential input signal pair. The DC offset may exist in the down-converted baseband signals. Eliminating the DC offset (step S930) can include eliminating the DC offset in the baseband signals by using a DC offset elimination loop. The DC offset elimination loop can include a first path, which outputs an output signal pair based on the baseband signal pair, and a second path, which eliminates the DC offset in the baseband signal pair by using the feedback signal pair obtained by feeding back the output signal pair. The OTA may be used for generating the feedback signal pair. Eliminating the DC offset will be described in detail with reference to FIGS. 10, 11, 12 and 13.

Figure 10:
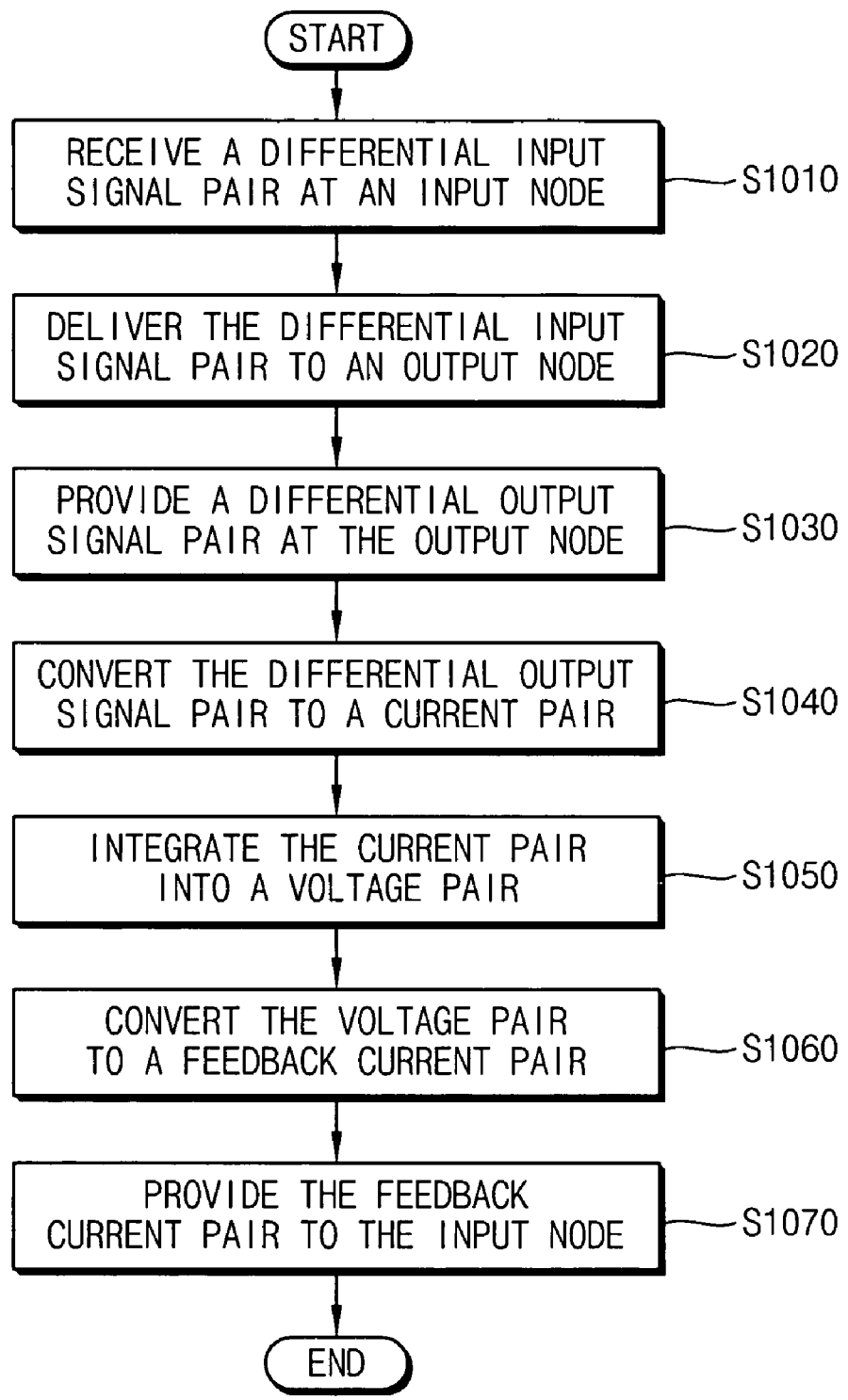
FIG. 10 is a flow chart illustrating a DC offset eliminating process in accordance with an exemplary embodiment of the present invention.

FIG. 10 is a flow chart illustrating a method of eliminating DC offset in accordance with an exemplary embodiment of the present invention.

A differential input signal pair is received through an input node of a DC offset elimination device (step S1010). The differential input signal pair corresponds to a baseband signal outputted from a mixer.

The received differential input signal pair is delivered to the output node of the DC offset elimination device (step S1020). The differential input signal pair may be amplified through the first path that delivers the received differential input signal pair to the output node.

The differential output signal pair is provided through the output node of the DC offset elimination device (step S1030). The differential output signal pair corresponds to the signals obtained by delivering the differential input signal pair via the first path. The differential output signal pair is converted to a feedback current pair via processes (steps S1040 through S1060) that will be described below.

The DC offset elimination device converts the differential output signal pair to current pair by using the OTA (step S1040) and integrates the current pair into the voltage pair (step S1050). Obtaining the current pair by using the OTA will be described with respect to FIGS. 11, 12 and 13.

The DC offset elimination device converts the voltage pair to the feedback current pair (step S1060), and then provides the feedback current pair to the input node (step S1070). The DC offset in the differential input signal pair is eliminated by the feedback current pair.

Figure 11:
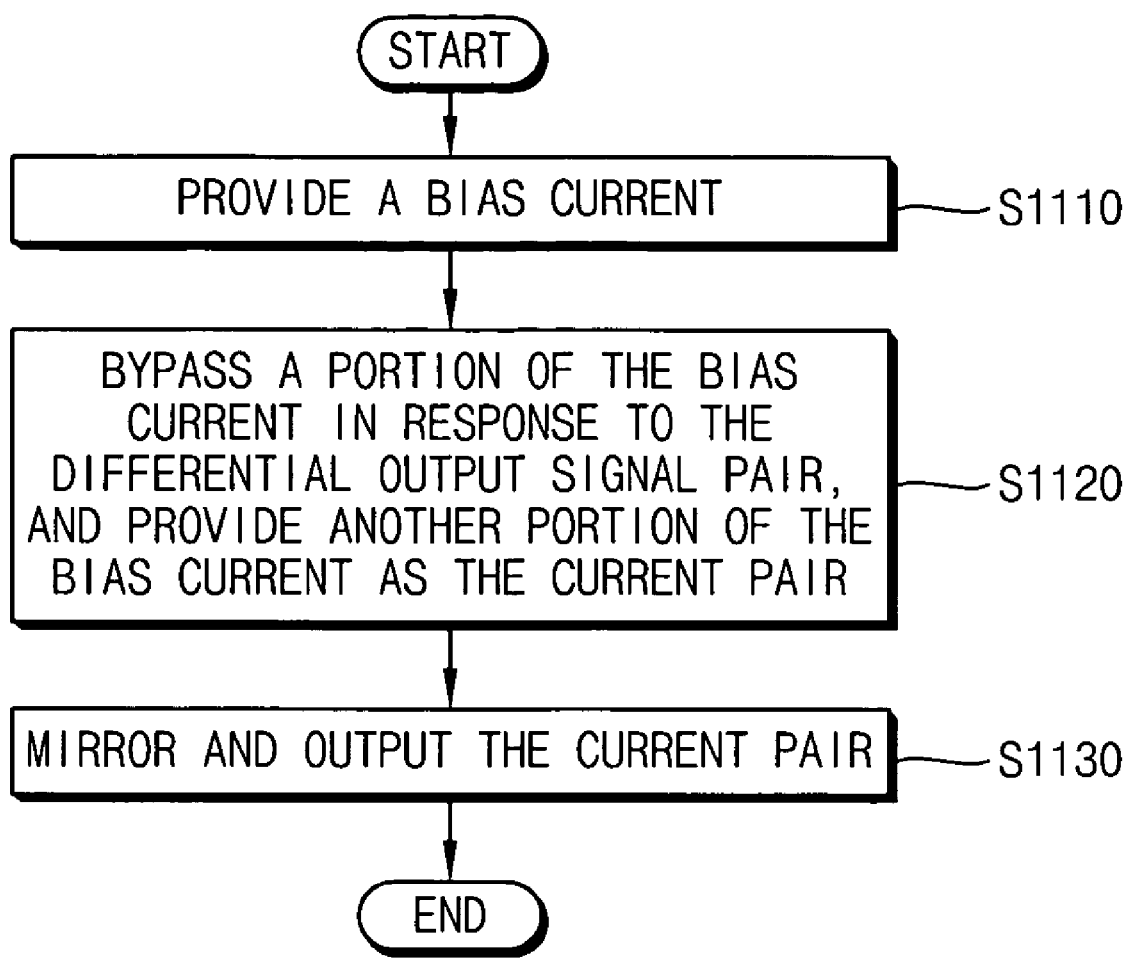
FIG. 11 is a flow chart illustrating a current pair generation process in accordance with an exemplary embodiment of the present invention.

FIG. 11 is a flow chart illustrating a process of converting the differential output signal pair to the current pair (step 1040) in FIG. 10.

The OTA of the DC offset elimination device provides a bias current for generating the current pair (step S1110). The OTA bypasses one portion, that is, a first portion, of the bias current in response to the differential input signal pair and provides the other portion, that is, a second portion, of the bias current as the current pair (step S1120). The OTA mirrors the current pair to output the mirrored current pair (step S1130). For example, the amount of the bypass current may be greater than that of the current pair so that the conductance of the OTA may be reduced.

As described above, there is an advantage of decreasing a cutoff frequency when the DC offset is eliminated by using the OTA with a small conductance. In turn, the direct conversion receiver (or the DC offset elimination device) with a low cutoff frequency may have a long initial settling time. In order to shorten a settling time, a method for generating a current pair will be described with reference to FIGS. 12 and 13.

Figure 12:
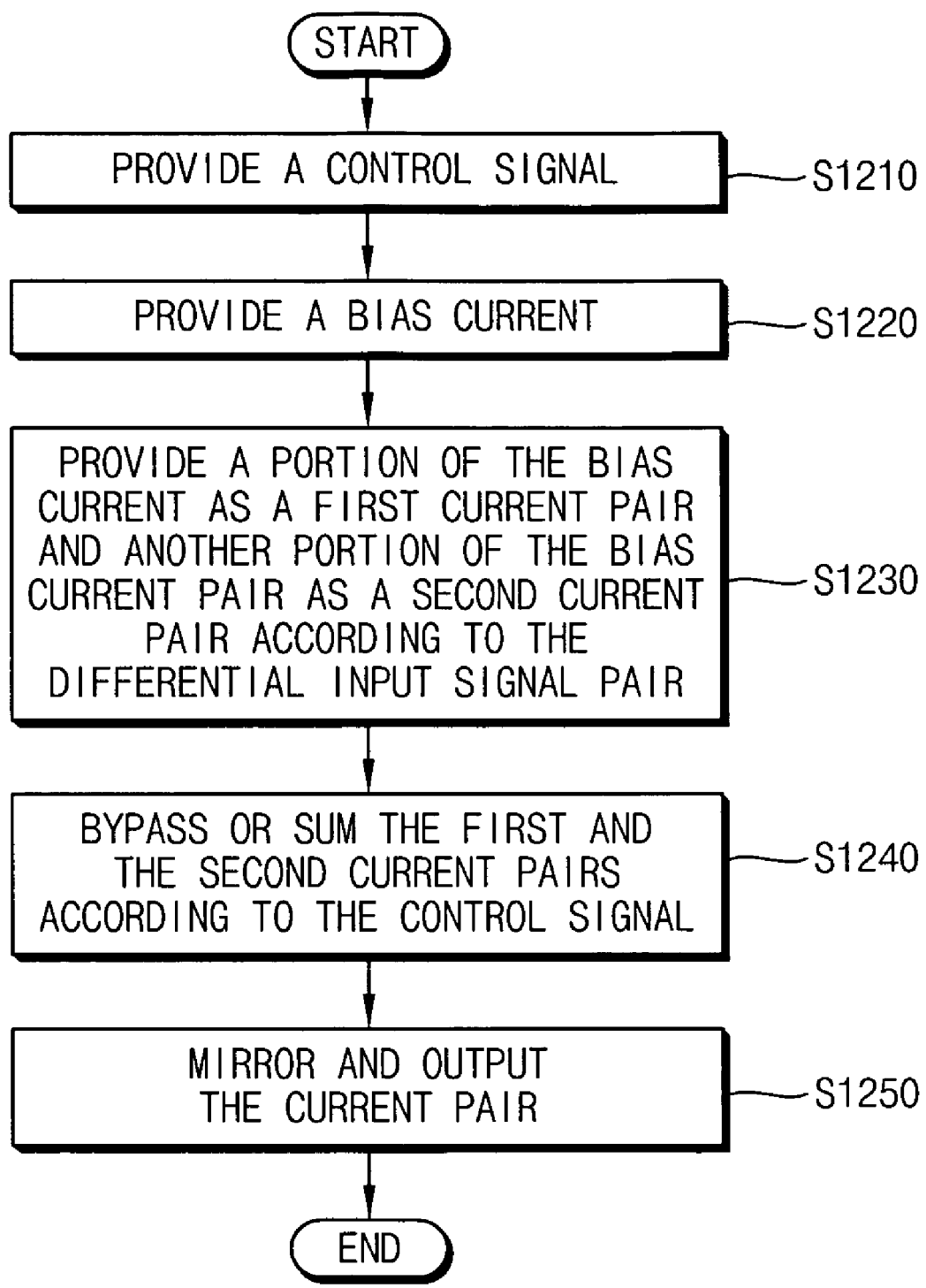
FIG. 12 is a flow chart illustrating a current pair generation process in accordance with an exemplary embodiment of the present invention.

FIG. 12 is a flow chart illustrating another process of converting the differential output signal pair to the current pair (step 1040) in FIG. 10.

Control signals are provided from a controller of the DC offset elimination device or from an external device (step S1210). The OTA of the DC offset elimination device provides a bias current for generating the current pair (step S1220). In addition, the OTA provides a first portion of the bias current as a first current pair in response to the differential input signal pair, and provides a second portion of the bias current as a second current pair (step S1230). Then, the OTA bypasses the second current pair, or sums the first and second current pairs in response to the control signals (step S1240). The OTA mirrors the current pair (the first current pair or the sum of the first and second current pairs) to output the mirrored current pair (step S1250).

In the case of bypassing the second current pair, the OTA has a small conductance as described with regard to FIG. 11. Accordingly, the DC offset may be eliminated with a low cutoff frequency. On the other hand, in the case of summing the second and first current pairs, a conductance of the OTA becomes greater. That is, when the conductance of the OTA becomes greater, the initial settling time of the DC offset elimination device becomes shorter. The amount of the current pair depends on the conductance of the OTA.

Figure 13:
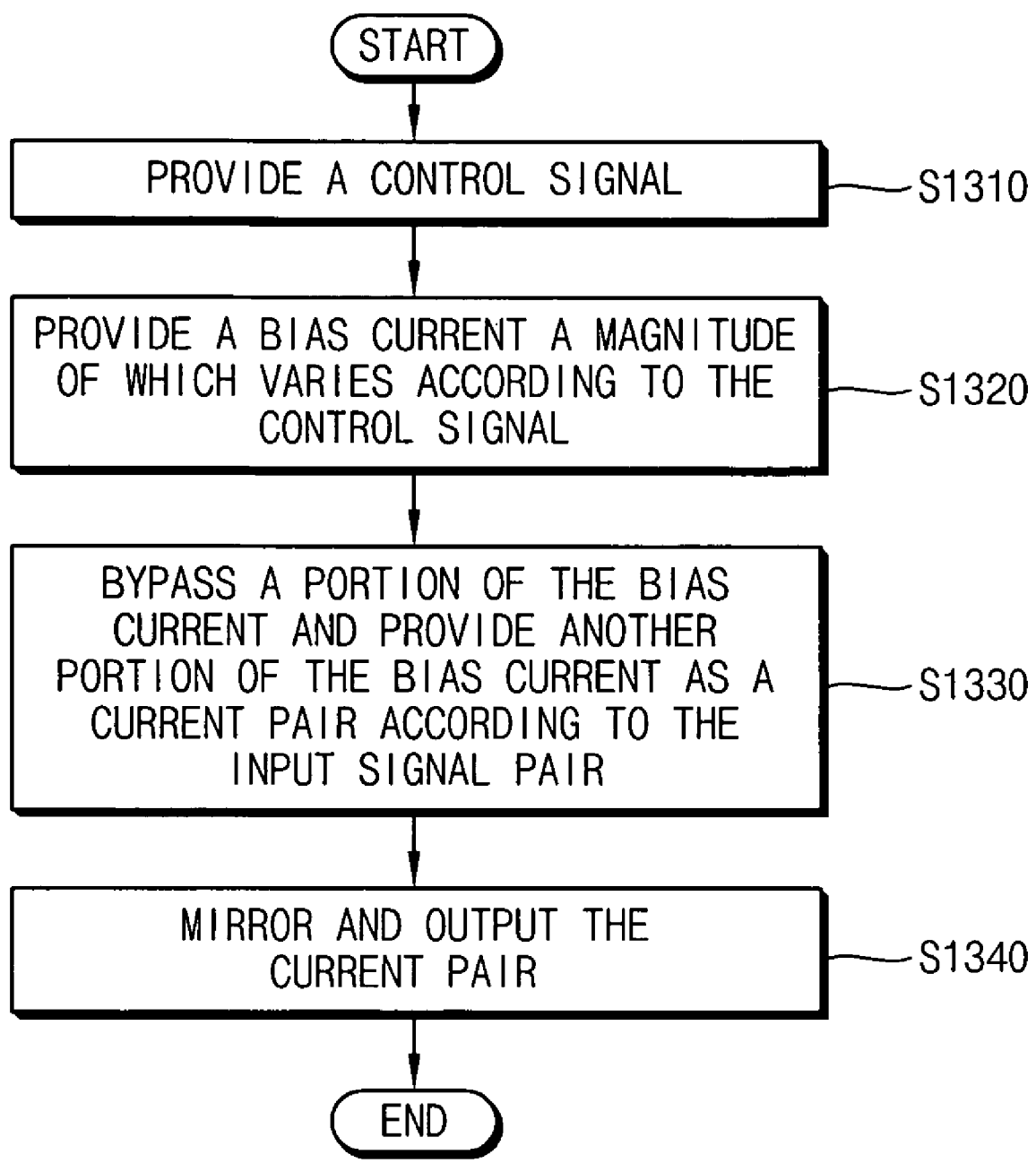
FIG. 13 is a flow chart illustrating a current pair generation process in accordance with an exemplary embodiment of the present invention.

FIG. 13 is a flow chart illustrating still another process of converting the differential output signal pair to the current pair (step 1040) in FIG. 10.

Control signals are provided from a controller of the DC offset elimination device or from an external device (step S1310). The OTA of the DC offset elimination device provides a different amount of a bias current in response to the control signals. Then, the OTA bypasses a portion of the bias current and provides a portion of the bias current as a current pair (step S1330). The OTA mirrors the current pair to provide the mirrored current pair (step S1340). The conductance of the OTA varies in proportion to the amount of the bias current. During the initial settling time, the settling time may be decreased when a large amount of the bias current is provided. On the other hand, after the initial settling time, the cutoff frequency may be reduced by providing a reduced amount of the bias current.

Figure 14:
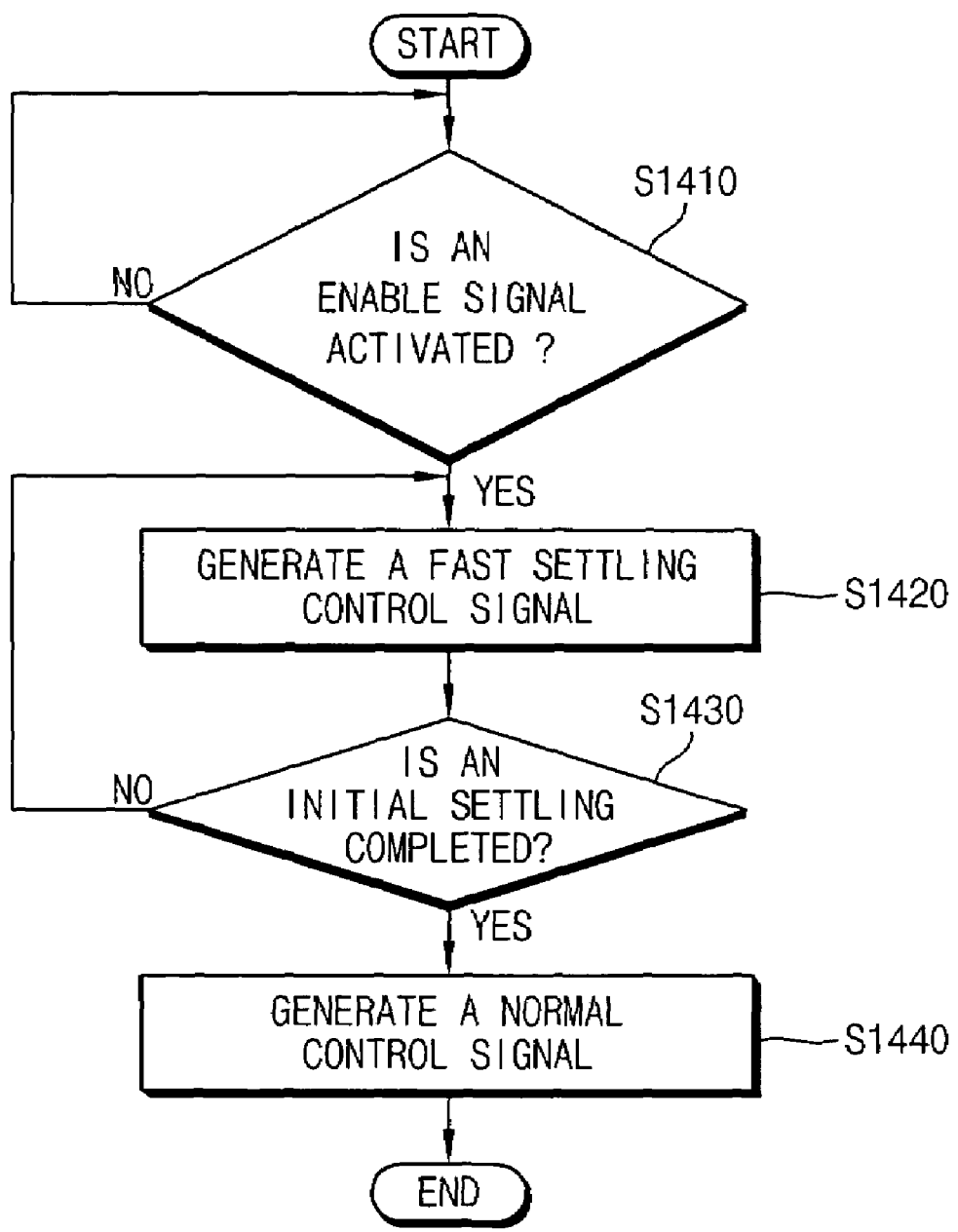
FIG. 14 is a flow chart illustrating a control signal generation process in accordance with an exemplary embodiment of the present invention.

FIG. 14 is a flow chart illustrating a process of providing the control signal (step 1210 and step 1310) in FIGS. 12 and 13.

The DC offset elimination device determines whether an enable signal is activated or not (step S1410). When the enable signal is activated, the DC offset elimination device generates a fast settling control signal for shortening an initial settling time (step S1420). When the fast settling control signal is generated, the cutoff frequency of the DC offset elimination device becomes higher.

The DC offset elimination device determines whether the initial settling is completed (step S1430), and generates a normal control signal when the initial settling is completed (step S1440). The fast settling control signal and the normal control signal may be an identical signal such that the logic levels of the signals represent whether the initial settling is completed or not.

As described above, the DC offset elimination device in accordance with exemplary embodiments of the present invention may have a low cutoff frequency and may be implemented in a small size. The direct conversion receiver including the DC offset elimination device with a low cutoff frequency may provide a good quality baseband signal from the RF signal.

In addition, the DC offset elimination device in accordance with exemplary embodiments of the present invention may have a short initial settling time and a low cutoff frequency after the initial settling is completed. The direct conversion receiver including the DC offset elimination device with a short initial settling time may provide a good quality baseband signal from the RF signal because of a low cutoff frequency.

The foregoing is illustrative of the present invention and is not to be construed as limiting thereof. Although a exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims.

What is claimed is:

1. A device for eliminating a DC offset, comprising:
   a first signal path for delivering a differential input signal pair from an input node to an output node; and
   a second signal path for feeding back a differential output signal pair from the output node to the input node, the second signal path including:
   a first transconductor having an input terminal coupled to the output node;
   an amplifier having an input terminal coupled to an output terminal of the first transconductor;
   a capacitor coupled in parallel to the amplifier; and
   a second transconductor coupled to the output terminal of the amplifier and to the input node,
   wherein the first transconductor comprises a differential operational transconductance amplifier (OTA).

2. The device of claim 1, wherein a conductance "g1" of the first transconductor corresponds to $$g_1 = \frac{2\pi AC}{g_2 R} f'_c,$$

where "A" is a gain of the first signal path, "C" is a capacitance of the capacitor, "R" is a resistance of a resistor of a load that provides the differential input signal pair, "g2" is a conductance of the second transconductor and "fc" is a cutoff frequency of the device for eliminating the DC offset.

3. The device of claim 2, wherein the first signal path comprises a variable gain amplifier that receives the differential input signal pair and amplifies the differential input signal pair by the gain "A" to output the differential output signal pair.

4. The device of claim 1, wherein the first transconductor comprises:
a bias circuit configured to provide a bias current;
a transconducting circuit configured to provide a current pair corresponding to a first portion of the bias current in response to the differential output signal pair;
a current divider configured to bypass a second portion of the bias current in response to the differential pair, a sum of the first portion and the second portion being equal to the bias current; and
an output circuit configured to mirror the current pair to output the mirrored current pair.

5. The device of claim 4, wherein a magnitude of a current bypassed by the current divider is greater than a magnitude of the current pair.

6. The device of claim 1, further comprising a controller producing a control signal to change a transconductance of the first transconductor.

7. The device of claim 6, wherein the first transconductor comprises:
a bias circuit configured to provide a bias current;
a first transconducting circuit configured to provide a first current pair corresponding to a first portion of the bias current in response to the differential output signal pair;
a second transconducting circuit configured to provide a second current pair corresponding to a second portion of the bias current in response to the differential output signal pair, a sum of the first portion and the second portion being equal to the bias current;
a switching circuit configured to selectively bypass the second current pair or to sum the first and the second current pairs in response to the control signal; and
an output circuit configured to mirror one of the first current pair and the sum of the first and the second current pairs to output the mirrored current pair.

8. The device of claim 7, wherein a magnitude of the second current pair is greater than a magnitude of the first current pair.

9. The device of claim 6, wherein the first transconductor comprises:
a bias circuit configured to provide a bias current such that a magnitude of the bias current is varied in response to the control signal;
a transconducting circuit configured to provide a current pair corresponding to a first portion of the bias current in response to the differential output signal pair;
a current divider configured to bypass a second portion of the bias current in response to the differential output signal pair, a sum of the first portion and the second portion being equal to the bias current; and
an output circuit configured to mirror the current pair to output the mirrored current pair.

10. The device claim 9, wherein the bias circuit comprises:
a first current source configured to provide a first current;
a second current source configured to provide a second current, a magnitude of the second current being different from a magnitude of the first current;
a selecting circuit configured to select one of the first and the second currents as the bias current in response to the control signal; and
a mirroring unit configured to output the bias current obtained by mirroring the selected current.

11. The device of claim 10, wherein the controller provides a first control signal for selecting the first current during an initial settling, and then provides a second control signal for selecting the second current after the initial settling is completed, a magnitude of the first current being greater than a magnitude of the second current.

12. The device of claim 9, wherein a magnitude of a current bypassed by the current divider is greater than a magnitude of the current pair.

13. A direct conversion receiver comprising:
an RF module configured to receive an RF signal;
a mixer configured to convert the RF signal into a baseband signal pair; and
a DC offset elimination device configured to eliminate a DC offset of the baseband signal pair, the DC offset elimination device including:
a first signal path configured to deliver the baseband signal pair from an input node to an output node; and
a second signal path for feeding back a differential output signal pair from the output node to the input node, the second signal path including:
a first transconductor having an input terminal coupled to the output node;
an amplifier having an input terminal coupled to an output terminal of the first transconductor;
a capacitor coupled in parallel to the amplifier; and
a second transconductor coupled to the output terminal of the amplifier and to the input node,
wherein the first transconductor comprises a differential operational transconductance amplifier (OTA).

14. The direct conversion receiver of claim 13, wherein the first transconductor comprises:
a bias circuit configured to provide a bias current;
a transconducting circuit configured to provide a current pair corresponding to a first portion of the bias current in response to the differential output signal pair;
a current divider configured to bypass a second portion of the bias current in response to the differential pair, a sum of the first portion and the second portion being equal to the bias current; and
an output circuit configured to mirror the current pair to output the mirrored current pair.

15. The direct conversion receiver of claim 14, wherein a magnitude of a current bypassed by a current divider is greater than a magnitude of the current pair.

16. The direct conversion receiver of claim 13, further comprising a controller providing a control signal to change a transconductance of the first transconductor.

17. The direct conversion receiver of claim 16, wherein the first transconductor comprises:
a bias circuit configured to provide a bias current;
a first transconducting circuit configured to provide a current pair corresponding to a first portion of the bias current in response to the differential output signal pair;

a second transconducting circuit configured to provide a current pair corresponding to a second portion of the bias current in response to the differential output signal pair, a sum of the first portion and the second portion being equal to the bias current;

a switching circuit configured to selectively bypass the second current pair or sum the first and the second current pairs in response to the control signal; and an output circuit configured to mirror one of the first current pair and the sum of the first and the second current pairs to output the mirrored current pair.

18. The direct conversion receiver of claim 17, wherein a magnitude of the second current pair is greater than a magnitude of the first current pair.

19. The direct conversion receiver of claim 16, wherein the first transconductor comprises:

a bias circuit configured to provide a bias current such that a magnitude of the bias current is varied in response to the control signal;

a transconducting circuit configured to provide a current pair corresponding to a first portion of the bias current in response to the differential output signal pair;

a current divider configured to bypass a second portion of the bias current in response to the differential output signal pair, a sum of the first portion and the second portion being equal to the bias current; and an output circuit configured to mirror the current pair to output the mirrored current pair.

20. The direct conversion receiver of claim 19, wherein the bias circuit comprises:

a first current source configured to provide a first current;

a second current source configured to provide a second current, a magnitude of the second current being different from a magnitude of the first current;

a selecting circuit configured to select one of the first and the second currents as the bias current in response to the control signal; and a mirroring unit configured to output the bias current obtained by mirroring the selected current.

21. The direct conversion receiver of claim 20, wherein the controller provides a first control signal for selecting the first current during an initial settling, and then provides a second control signal for selecting the second current after the initial settling is completed, a magnitude of the first current being greater than a magnitude of the second current.

22. The direct conversion receiver of claim 21, wherein a magnitude of current bypassed by the current divider is greater than a magnitude of the current pair.

23. A method of eliminating a DC offset, comprising:

providing a differential output signal pair by delivering a differential input signal pair from an input node to an output node through a first signal path;

converting the differential output signal pair to a current pair;

integrating the current pair into a voltage pair;

converting the voltage pair into a feedback current pair; and providing the feedback current pair to the input node, wherein converting the differential output signal pair to the current pair comprises:

providing a bias current:

providing a first current pair corresponding to a first portion of the bias current in response to the differential output signal pair;

bypassing a second portion of the bias current in response to the differential output signal pair, a sum of the first portion and the second portion being equal to the bias current; and mirroring the first current pair to output the mirrored current pair as the current pair.

24. The method of claim 23, wherein a magnitude of the bypassed current is greater than a magnitude of the first current pair.

25. The method of c1 aim 23, wherein converting the differential output signal pair to the current pair comprises:

providing a bias current, a magnitude of the bias current being varied in response to a control signal;

providing a first current pair corresponding to a first portion of the bias current in response to the differential output signal pair;

bypassing a second portion of the bias current in response to the differential output signal pair; and mirroring the first current pair to output the mirrored current pair as the current pair.

26. The method of claim 25, wherein providing the bias current comprises:

providing the bias current of a first magnitude during an initial settling; and providing the bias current of a second magnitude after the initial settling is completed, the second magnitude being greater than the first magnitude.

27. A method of eliminating a DC offset, comprising:

providing a differential output signal pair by delivering a differential input signal pair from an input node to an output node through a first signal path;

converting the differential output signal pair to a current pair;

integrating the current pair into a voltage pair;

converting the voltage pair into a feedback current pair; and providing the feedback current pair to the input node, wherein converting the differential output signal pair to the current pair comprises:

providing a bias current;

providing a first current pair corresponding to a first portion of the bias current pair in response to the differential output signal pair;

providing a second current pair corresponding to a second portion of the bias current pair in response to the differential output signal pair, a sum of the first portion and the second portion being equal to the bias current;

selecting one of bypassing the second current pair or summing the first and the second current pairs; and mirroring one of the first current pair and the sum of the first and second current pairs to output the current pair.

28. The method of claim 27, wherein a magnitude of the second current pair is greater than a magnitude of the first current pair.

29. A direct conversion method comprising:

down-converting a received RF signal to provide a baseband signal pair;

providing a differential output signal pair by delivering the baseband signal pair from an input node to an output node through a first signal path;

converting the differential output signal pair to a current pair;

integrating the current pair into a voltage pair;

converting the voltage pair into a feedback current pair; and providing the feedback current pair to the input node to eliminate a DC offset in the baseband signal pair, wherein converting the differential output signal pair to the current pair comprises:

providing a bias current;

providing a first current pair corresponding to a first portion of the bias current in response to the differential output signal pair;

bypassing a second portion of the bias current in response to the differential output signal pair, a sum of the first portion and the second portion being equal to the bias current; and mirroring the first current pair to output the mirrored current pair as the current pair.

30. The direct conversion method of claim 29, wherein a magnitude of the bypassed current is greater than a magnitude of the first current pair.

31. A direct conversion method comprising:

down-converting a received RF signal to provide a baseband signal pair;

providing a differential output signal pair by delivering the baseband signal pair from an input node to an output node through a first signal path;

converting the differential output signal pair to a current pair;

integrating the current pair into a voltage pair;

converting the voltage pair into a feedback current pair; and providing the feedback current pair to the input node to eliminate a DC offset in the baseband signal pair, wherein converting the differential output signal pair to the current pair comprises:

providing a bias current;

providing a first current pair corresponding to a first portion of the bias current in response to the differential output signal pair;

providing a second current pair corresponding to a second portion of the bias current in response to the differential output signal pair, a sum of the first portion and the second portion being equal to the bias current;

selecting one of bypassing the second current pair or summing the first and the second current pairs; and mirroring one of the first current pair and the sum of the first and second current pairs to output the current pair.

32. The direct conversion method of claim 31, wherein a magnitude of the second current pair is greater than a magnitude of the first current pair.

33. The direct conversion method of claim 32, wherein converting the differential output signal pair to the current pair comprises:

providing a bias current, a magnitude of the bias current being varied in response to a control signal;

providing a first current pair corresponding to a first portion of the bias current in response to the differential output signal pair;

bypassing a second portion of the bias current in response to the differential output signal pair; and mirroring the first current pair to output the mirrored current pair as the current pair.

34. The direct conversion method of claim 33, wherein providing the bias current comprises:

providing the bias current of a first magnitude during an initial settling; and providing the bias current of a second magnitude after the initial settling is completed, the second magnitude being greater than the first magnitude.

* * * * *